US008395609B2

(12) United States Patent
Kwak

(10) Patent No.: US 8,395,609 B2

(45) **Date of Patent: *Mar. 12, 2013**

(54) ORGANIC LIGHT EMITTING DISPLAY DEVICE AND MOTHER SUBSTRATE FOR PERFORMING SHEET UNIT TEST AND TESTING METHOD THEREOF

(75) Inventor: Won Kyu Kwak, Seongnam (KR)

(73) Assignee: Samsung Display Co., Ltd., Yongin-si (KR)

( * ) Notice: Subject to any disclaimer, the term of this patent is extended or adjusted under 35 U.S.C. 154(b) by 728 days.

This patent is subject to a terminal disclaimer.

(21) Appl. No.: 11/636,241

(22) Filed: Dec. 8, 2006

(65) Prior Publication Data

US 2007/0139312 A1 Jun. 21, 2007

(30) Foreign Application Priority Data

Dec. 21, 2005 (KR) ........................ 10-2005-0127226

(51) Int. Cl.

*G06F 3/038* (2006.01)
*G09G 3/30* (2006.01)
*G01R 31/26* (2006.01)
*H01L 23/58* (2006.01)
*H01J 1/62* (2006.01)

(52) U.S. Cl. .............. 345/206; 345/76; 438/14; 257/48; 313/500

(58) Field of Classification Search ............ 345/76–104, 345/204–215, 690; 315/291; 428/690; 340/643; 313/498–512; 438/5–6, 10–11, 14, 17–18

See application file for complete search history.

(56) References Cited

U.S. PATENT DOCUMENTS 5,053,700 A 10/1991 Parrish
5,608,335 A 3/1997 Tailliet
6,265,889 B1 7/2001 Tomita et al.
6,639,646 B2 10/2003 Lim
6,707,065 B2 * 3/2004 Fenner et al. ................... 257/48

(Continued)

FOREIGN PATENT DOCUMENTS

EP 1 496 495 A2 1/2005
JP 2000-200053 7/2000

(Continued)

OTHER PUBLICATIONS

Korean Patent Abstracts, Publication No. 1020040028363 A; Publication Date: Apr. 3, 2004; in the name of Kim, et al.

*Primary Examiner* — Bipin Shalwala
*Assistant Examiner* — Keith Crawley
(74) *Attorney, Agent, or Firm* — Christie, Parker & Hale, LLP

(57) ABSTRACT

In a testing method for an organic light emitting display device on a mother substrate, a sheet unit test is performed by directly supplying a test signal to a display region, rather than passing through a data distributor. The organic light emitting display device includes: a display region including pixels coupled to scan lines and data lines; a scan driver for supplying scan signals to the scan lines; a data driver for supplying data signals to output lines; a data distributor for supplying data signals to the data lines; a transistor group including transistors each coupled to one or more of the data lines; and a first wire group and a second wire group, wherein one of the wires included in the first wire group and the second wire group is coupled to gate electrodes of various transistors in the transistor group.

20 Claims, 6 Drawing Sheets

U.S. PATENT DOCUMENTS

| | | | | |
|---|---|---|---|---|
| 6,734,925 | B1 | 5/2004 | Lee et al. | |
| 6,762,735 | B2 | 7/2004 | Koyama | |
| 6,956,396 | B2 | 10/2005 | Lai et al. | |
| 7,027,043 | B2 | 4/2006 | Sakaki | |
| 7,476,553 | B2 * | 1/2009 | Hara et al. | 438/14 |
| 2003/0010977 | A1 * | 1/2003 | Fenner et al. | 257/48 |
| 2003/0049871 | A1 * | 3/2003 | Higashi | 438/14 |
| 2003/0067319 | A1 | 4/2003 | Cho | |
| 2003/0146694 | A1 * | 8/2003 | Lee et al. | 313/505 |
| 2004/0135749 | A1 * | 7/2004 | Kondakov et al. | 345/82 |
| 2004/0191963 | A1 | 9/2004 | Pichler | |
| 2005/0001794 | A1 * | 1/2005 | Nakanishi et al. | 345/76 |
| 2005/0168416 | A1 * | 8/2005 | Hashimoto et al. | 345/76 |
| 2005/0258769 | A1 * | 11/2005 | Imamura | 315/161 |
| 2005/0280434 | A1 * | 12/2005 | Whetsel | 324/765 |
| 2006/0007768 | A1 * | 1/2006 | Kim | 365/205 |
| 2006/0017373 | A1 * | 1/2006 | Lee | 313/500 |
| 2006/0060851 | A1 * | 3/2006 | Kawata | 257/59 |
| 2007/0046316 | A1 * | 3/2007 | Uei et al. | 324/770 |
| 2007/0244593 | A1 * | 10/2007 | Kinoshita | 700/108 |

FOREIGN PATENT DOCUMENTS

| | | |
|---|---|---|
| JP | 2004-063407 | 2/2004 |
| JP | 2005-043205 | 2/2005 |
| JP | 2005-164679 | 6/2005 |
| KR | 10-2004-0028363 | 4/2004 |
| KR | 10-2005-0025513 | 3/2005 |
| KR | 10-0673749 | 1/2007 |

* cited by examiner

ORGANIC LIGHT EMITTING DISPLAY DEVICE AND MOTHER SUBSTRATE FOR PERFORMING SHEET UNIT TEST AND TESTING METHOD THEREOF

CROSS-REFERENCE TO RELATED APPLICATIONS

This application claims priority to and the benefit of Korean Patent Application No. 10-2005-0127226, filed on Dec. 21, 2005, in the Korean Intellectual Property Office, the entire content of which is incorporated herein by reference.

BACKGROUND

1. Field of the Invention

The present invention relates to an organic light emitting display device, a mother substrate, and a testing method thereof. More particularly, the present invention relates to an organic light emitting display device, a mother substrate, and a testing method, in which a sheet unit test is performed by directly supplying a test signal to a display region of the organic light emitting display device, rather than transmitting the test signal through a data distributor of the same.

2. Discussion of Related Art

Generally, after a plurality of organic light emitting display devices are formed on one mother substrate, they are scribed so as to be separated to individual organic light emitting display devices. Tests for the organic light emitting display devices are separately performed in each organic light emitting display device which has been scribed.

FIG. 1 is a diagram showing a conventional organic light emitting display device 110 that has been scribed.

Referring to FIG. 1, the organic light emitting display device 110 includes a scan driver 120, a data driver 130, a data distributor 140, and a display region 150.

The scan driver 120 generates scan signals. The scan signals generated in the scan driver 120 are sequentially supplied to scan lines S1 to Sn.

The data driver 130 generates data signals. The data signals generated in the data driver 130 are supplied to output lines O1 to Om.

The data distributor 140 distributes the data signals, which are supplied from the output lines O1 to Om of the data driver 130, to at least two data lines of the set of data lines D1 . . . D3*m*. The data distributor 140 reduces the number of channels of the data driver 130, and is useful for a display of high resolution.

The display region 150 includes a plurality of pixels (not shown) including organic light emitting diodes. The display region 150 displays a predetermined image in correspondence to first and second voltage sources ELVDD (not shown) and ELVSS (not shown) supplied from outside the display region 150 and the data signals supplied from the data distributor 140.

The tests for the organic light emitting display devices 110 are performed with test equipment for testing the individual organic light emitting display devices. If the circuit wires of the organic light emitting display devices 110 are changed or the sizes of the organic light emitting display devices 110 are changed, the test equipment or jigs for the test should be changed. Further, since the organic light emitting display devices 110 should be separately tested, the test time and the cost increase, thereby lowering the efficiency of the test. Therefore, it is desirable to perform the tests for the plurality of organic light emitting display devices 110 on the mother substrate in a sheet unit before scribing the organic light emitting display devices 110. Further, it is desirable to perform the tests of sheet unit without a problem due to a signal delay when the tests are performed on the mother substrate.

SUMMARY OF THE INVENTION

Accordingly, one embodiment of the present invention provides an organic light emitting display device, a mother substrate, and a testing method, in which a sheet unit test for a plurality of organic light emitting display devices formed on the mother substrate can be performed.

Another embodiment of the present invention provides an organic light emitting display device, a mother substrate, and a testing method, in which a sheet unit test can performed by directly supplying a test signal to a display region, with the test signal not passing through a data distributor in order to remove a drive signal delay problem of a data distributor.

According to the first aspect of the present invention, there is provided an organic light emitting display device including: a display region including a plurality of pixels coupled to scan lines and data lines; a scan driver for supplying scan signals to the scan lines; a data driver for supplying data signals to output lines, which are supplied to the data distributor; a data distributor for supplying data signals to the data lines; a transistor group including a plurality of transistors each of which is coupled to one of the data lines; and a first wire group including a plurality of wires and a second wire group including a plurality of wires, wherein one of the wires included in the first wire group or the second wire group is coupled to gate electrodes of at least two of the transistors included in the transistor group.

In some embodiments, the transistors included in the test section maintain off states responsive to a control signal supplied to the first wire group or the second wire group. The data distributor is formed on a first side of the display region and the test section is formed on a second side of the display region wherein the first side is opposite the second side.

According to the second aspect of the present invention, there is provided a mother substrate including: a plurality of organic light emitting display devices, at least one of the organic light emitting display devices including: a data distributor coupled to data lines; and a test section including transistors, each transistor coupled to one of the data lines, wherein gate electrodes of the transistors are substantially simultaneously turned on by a test control signal supplied from a wire of a first wire group or a second wire group; the first wire group coupled to the organic light emitting display devices that are arranged substantially in a first direction; and a second wire group coupled to the organic light emitting display devices that are arranged substantially in a second direction.

In one embodiment, source electrodes coupled to the transistors included in the test section are coupled to at least one wire included in the first wire group or the second wire group, and supply test signals to the data lines when the transistors are turned on. The transistors of the test section include first transistors coupled to data lines of red sub-pixels, second transistors coupled to data lines of green sub-pixels, and third transistors coupled to data lines of blue sub-pixels. The first transistors receive a red test signal from a first predetermined wire included in the first wire group or second wire group, the second transistors receive a green test signal from a second predetermined wire included in the first or second wire group, and the third transistors receive a blue test signal from a third predetermined wire included in the first or second wire group. The test signal is one for performing at least one of a flickering test, a leakage current test or an aging test. The data distributor is coupled to a first portion of the data lines and the test section coupled to a second portion of one of the data lines. The data distributor receives a bias voltage from a wire included in the first or second wire group, wherein the bias voltage enables the data distributor to maintain an off state. Each of the organic light emitting display devices includes a scan driver for supplying scan signals to the scan lines; and a display region including a plurality of pixels coupled to the scan lines and the data lines. The scan driver and the display region receives voltage from a voltage source and a signal from at least one wire included in the first wire group or the second wire group. Each of the organic light emitting display devices includes a data driver coupled to the data distributor and is configured to supply the data signals to output lines. Electric contact points between the first wire group and the second wire group and a plurality of elements formed in the organic light emitting display devices are located outside of a scribing line.

According to the third aspect of the present invention, there is provided a testing method for testing at least one of a plurality of organic light emitting display devices on a mother substrate, the testing method including: supplying scan signals to scan lines formed in at least one of a plurality of organic light emitting display devices; substantially simultaneously turning on transistors coupled to data lines formed in at least one of the plurality of organic light emitting display devices; and transmitting test signals through the transistors thereby supplying the test signals to the data lines after the transistors are turned on.

In one embodiment, substantially simultaneously turning on transistors includes turning off distribution transistors formed in the organic light emitting display devices and included in a data distributor. The test signals include at least one of a red test signal, a green test signal or a blue test signal. The test signals perform at least one of a flickering test, an aging test or a leakage current test.

In another embodiment, a testing method of an organic light emitting display device for testing at least one of a plurality of organic light emitting display devices on a mother substrate is provided. The method includes: supplying a test signal to a display region of one of the organic light emitting display devices; supplying a scan signal to the display region; and providing a bias voltage to a transistor of a data distributor to turn off the data distributor when the test signal is supplied. The test signal is one of red, blue or green test signals.

DETAILED DESCRIPTION OF EMBODIMENTS

Figure 1:
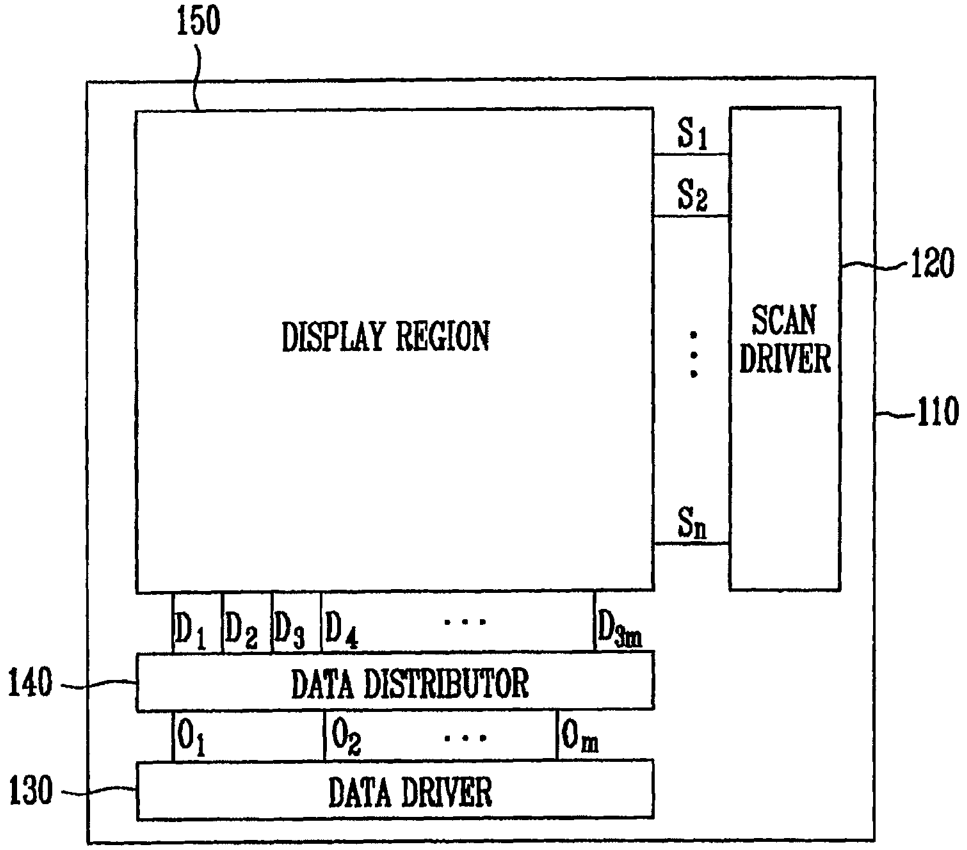
FIG. 1 (PRIOR ART)
FIG. 1 is a diagram showing a conventional organic light emitting display device that has been scribed.
Figure 2:
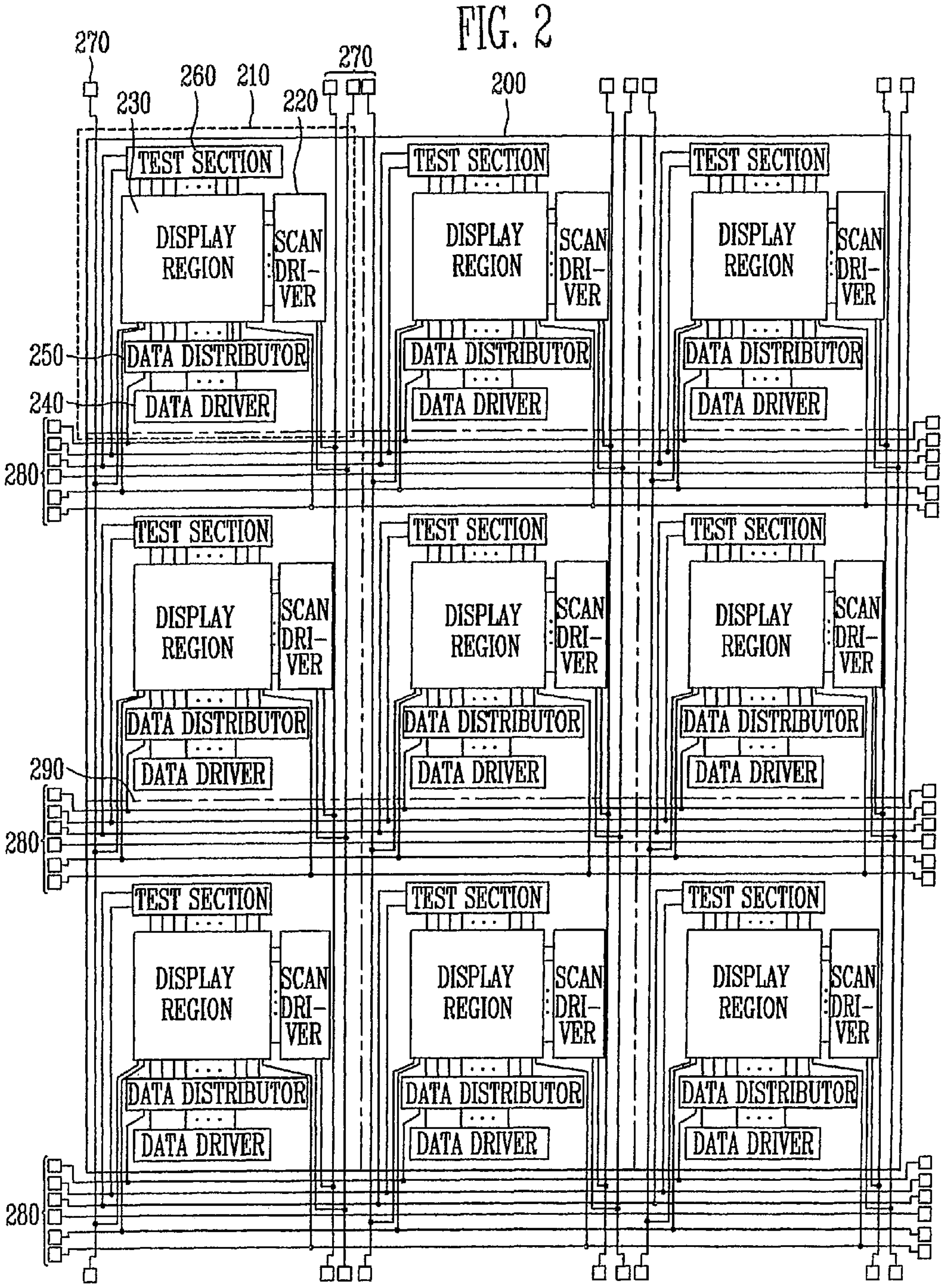
FIG. 2 is a diagram showing a mother substrate on which organic light emitting display devices according to an embodiment of the present invention are formed.

FIG. 2 is a diagram showing a mother substrate 200 on which organic light emitting display devices according to an embodiment of the present invention are formed.

Referring to FIG. 2, the mother substrate 200 of the organic light emitting display device according to the embodiment of the present invention includes a plurality of organic light emitting display devices 210 arranged in matrix format, and a first wire group 270 and a second wire group 280.

In the embodiment shown in FIG. 2, first wire group 270 is formed in the vertical direction (a first direction), and is commonly coupled to the organic light emitting display devices 210 located in a same column on the mother substrate 200. The second wire group 280 is formed in the horizontal direction (a second direction), and is commonly coupled to the organic light emitting display devices 210 located in a same row on the mother substrate 200. The first and second wire groups 270 and 280 supply voltage sources and signals for a sheet unit test to at least one of scan drivers 220, display regions 230, data distributors 250, and test sections 260 formed on the organic light emitting display devices 210.

Figure 3:
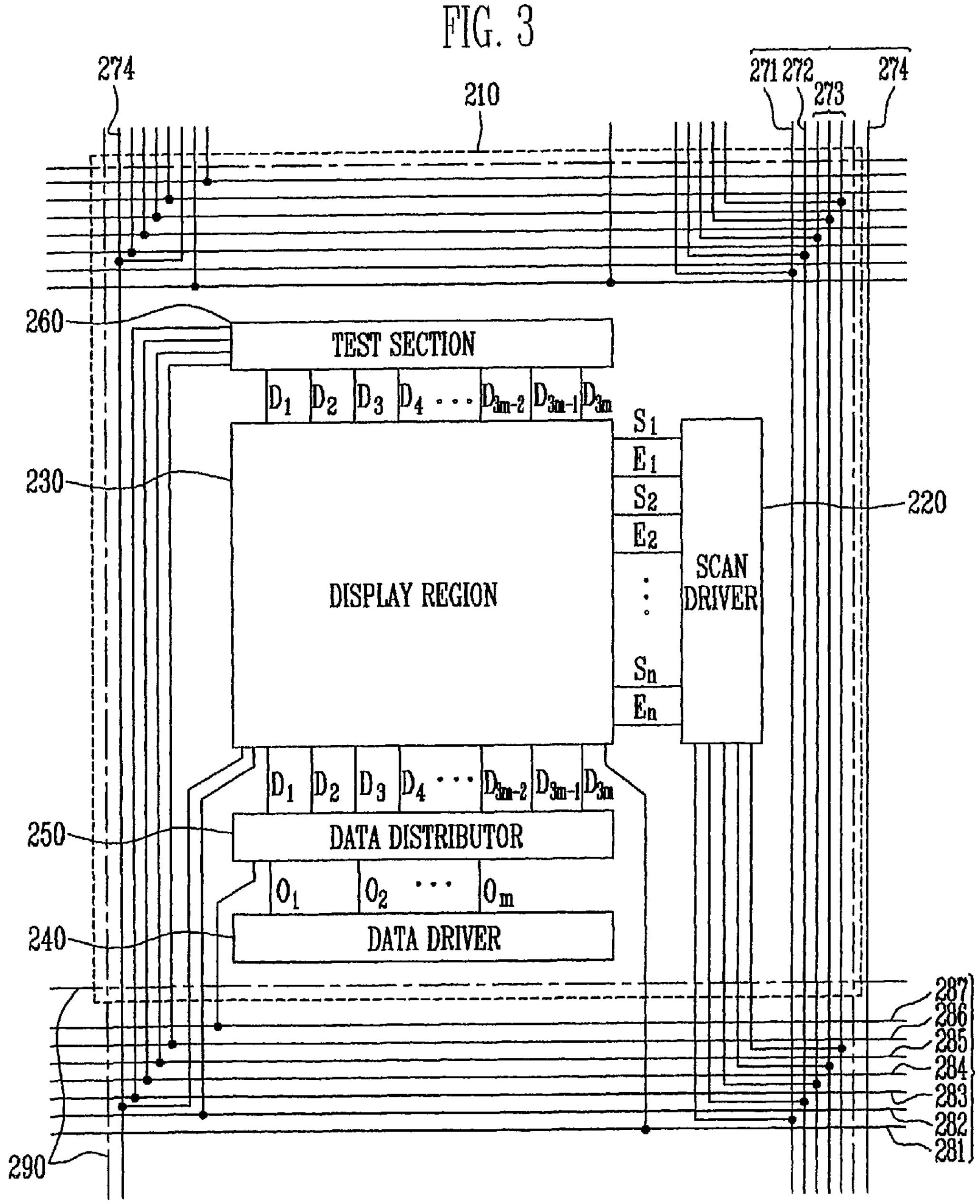
FIG. 3 is a diagram showing an embodiment of one of the organic light emitting display devices shown in FIG. 2 and an embodiment of its corresponding wire groups.

Each of the organic light emitting display devices 210 includes a scan driver 220, a display region 230, a data driver 240, a data distributor 250, and a test section 260. The scan driver 220, the display region 230, the data driver 240, the data distributor 250, and the test section 260 will be described in detail when FIG. 3 is explained.

Since the mother substrate 200 of the organic light emitting display device according to the embodiment of the present invention includes the first and second wire groups 270 and 280, the sheet unit test can be performed, with the organic light emitting display devices 210 formed on the mother substrate not being scribed. More particularly, the tests are performed in the organic light emitting display devices 210 coupled to the first and second wire groups 270 and 280, by supplying voltage sources and signals for the sheet unit tests to the first and second wire groups 270 and 280. Therefore, the test time and the costs can be reduced, thereby increasing the efficiency of the test. Further, even if the circuit wires of the organic light emitting display device 210 are changed or the size of the organic light emitting display device 210 is changed, the test can be performed without changing test equipment or jigs in the case in which the circuit wires of the first and second wire groups 270 and 280 and the size of the mother substrate 200 are not changed.

Further, according to one embodiment of the present invention, since voltage sources and signals are supplied to the first and second wire groups 270 and 280, which are coupled to at least one predetermined organic light emitting display device 210, it is possible to perform a test in the predetermined organic light emitting display device 210 among the organic light emitting display devices 210 formed in the mother substrate 200.

On the other hand, if the sheet unit test is completed, the organic light emitting display devices 210 formed on the mother substrate 200 are scribed. Here, a scribing line 290 is located so as to be electrically separated from the first wire group 270 and the second wire group 280, the scan driver 220, the display region 230, the data distributor 250, and the test section 260, which are included in the organic light emitting display device 210, after they are scribed. Namely, the electric contact points of the first wire group 270 and the second wire group 280, the scan driver 220, the display region 230, the data distributor 250 and the test section 260 are located on the outer side of the scribing line 290 of the organic light emitting display device 210 as shown in FIG. 2. Therefore, the noise such as static electricity, which is introduced to the first and second wire groups 270 and 280 from outside, is not supplied to the scan driver 220, the display region 230, the data distributor 250 or the test section 260.

FIG. 3 is a diagram showing an embodiment of one of the organic light emitting display devices shown in FIG. 2 and an embodiment of its corresponding wire groups.

Referring to FIG. 3, the organic light emitting display device 210 includes a scan driver 220, a display region 230, a data driver 240, a data distributor 250, and a test section 260. Further, the first and second wire groups 270 and 280 are located on the outer side of the organic light emitting display device 210 as shown in FIG. 3.

The first wire group 270 includes a first wire 271 to which voltage from a third voltage source VDD (not shown) is supplied, a second wire 272 to which voltage from a fourth voltage source VSS (not shown) is supplied, third wires 273 to which scan control signals are supplied, and a fourth wire 274 to which voltage from a first voltage source ELVDD (not shown) is supplied.

The first wire 271 supplies voltage from the third voltage source VDD to the scan driver 220 formed in each of the organic light emitting display devices 210. The voltage from the voltage source VDD is supplied during the sheet unit test.

The second wire 272 supplies voltage from the fourth voltage source VSS, which is supplied during the sheet unit test, to the scan driver 220 formed in each of the organic light emitting display devices 210.

The third wires 273 receive the scan control signals, which are supplied during the sheet unit test, and supply the scan control signals to the scan driver 220 formed in each of the organic light emitting display devices 210. The scan control signals can include a clock signal of the scan driver 220, an output enable signal, a start pulse, and the like. Actually, the number of the scan control signals supplied to the scan driver 220 can be variously set by the circuit of the scan driver 220. Therefore, the number of the third wires 273 is determined by the circuit of the scan driver 220. Hereinafter, in the embodiments described, the third wires 273 are assumed to include three wires, although other numbers of third wires 273 are also possible.

The fourth wire 274 supplies the voltage from the first voltage source ELVDD, which is supplied during the sheet unit test, to the display region 230 formed in each of the organic light emitting display devices 210.

The second wire group 280 includes an eleventh wire 281 to which voltage from a second voltage source ELVSS (not shown) is supplied, a twelfth wire 282 to which voltage from an initializing voltage source Vinit (not shown) is supplied, a thirteenth wire 283 to which a red test signal is supplied, a fourteenth wire 284 to which a green test signal is supplied, a fifteenth wire 285 to which a blue test signal is supplied, a sixteenth wire 286 to which a test control signal is supplied, and a seventeenth wire 287 to which a bias voltage is supplied.

The eleventh wire 281 supplies the voltage from the second voltage source ELVSS supplied during the sheet unit test to the display region 230 formed in each of the organic light emitting display devices 210.

The twelfth wire 282 supplies the voltage from the initializing voltage source Vinit supplied during the sheet unit test to the display region 230 formed in each of the organic light emitting display devices 210.

The thirteenth wire 283 supplies the red test signal supplied during the sheet unit test to the test section 260 formed in each of the organic light emitting display devices 210.

The fourteenth wire 284 supplies the green test signal supplied during the sheet unit test to the test section 260 formed in each of the organic light emitting display devices 210.

The fifteenth wire 285 supplies the blue test signal supplied during the sheet unit test to the test section 260 formed in each of the organic light emitting display devices 210.

The sixteenth wire 286 supplies the test control signal supplied during the sheet unit test to the test section 260 formed in each of the organic light emitting display devices 210.

The seventeenth wire 287 supplies the bias voltage supplied during the sheet unit test to the data distributor 250 formed in each of the organic light emitting display devices 210.

Here, although, in this particular embodiment, each of the pixels in the display region 230 includes red, green, and blue sub-pixels (not shown) and the test section 260 receives the red, green, and blue test signals from the thirteenth to fifteenth wires 283 to 285 and supplies them to the red, green, and blue sub-pixels, the present invention is not limited thereto. For example, the number of test signals can be variously set according to the number of the sub-pixels in one pixel. Further, the number of the wires supplying the test signals can be the same as the number of the sub-pixels.

Further, although the first to fourth wires 271 to 274 and the eleventh to seventeenth wires 281 to 287 are included in the first wire group 270 and the second wire group 280, respectively, the present invention is not limited thereto. For example, the first wire 271 supplying the voltage from the first voltage source ELVDD can be set so as to be included in both the first and second wire groups 270 and 280 or in one of the first and second wire groups 270 and 280.

The scan driver 220 receives the voltages from the third voltage source VDD and the fourth voltage source VSS and the scan control signals from the first wire 271, the second wire 272, and the third wires 273, respectively, wherein the wires 271, 272 and 273 are included in the first wire group 270. The scan driver 220 generates a scan signal and a light emitting control signal in correspondence to the third and fourth voltage source VDD and VSS and the scan control signals. The scan signals and the light emitting control signals, which are generated in the scan driver 220, are supplied to the display region 230. The scan signals are supplied to the display region 230 via the scan lines S1, S2, . . . , Sn and the light emitting control signals are supplied to the display region 230 via the light emitting control lines E1, E2, . . . , En. In an alternate embodiment, it is possible that the scan driver 220 generates the scan signals and a separate light emitting control driver generates the light emitting control signals.

The display region 230 includes a plurality of pixels (not shown), each pixel including an organic light emitting diode. In one embodiment, one pixel includes red, green, and blue sub-pixels. The display region 230 receives voltages from the first voltage source ELVDD, the second voltage source ELVSS, and the initializing voltage source Vinit from the fourth wire 274 and the eleventh and twelfth wires 281 and 282. In addition, the display region 230 receives at least one of the red, green or blue test signals from the test section 260 during the sheet unit test. The display region 230, upon receiving voltages from the first voltage source ELVDD, the initializing voltage source Vinit, the second voltage source ELVSS, and the test signal, displays a predetermined image corresponding to the received voltages and test signal. On the other hand, after the organic light emitting display devices 210 are scribed, the display region 230 receives a data signal from the data distributor 250, and displays an image corresponding to the received data signal.

The data driver 240 generates a data signal that may correspond to data supplied from outside of the organic light emitting display devices 210. The one or more organic light emitting display devices 210 have been scribed from the mother substrate 200. The data signal generated in the data driver 240 may be supplied to the data distributor 250. The data driver 240 can be formed on the mother substrate 200 or can be mounted to each of the organic light emitting display devices 210 in chip type after the organic light emitting display device 210 is scribed.

The data distributor 250 supplies the data signals supplied to each output line O of the data driver 240 to three data lines of the red, green, and blue sub-pixels. The data distributor 250 reduces the number of channels of the data driver 240 and thus may be useful in a display of high resolution. In an alternate embodiment, the data distributor 250 is set so as to be off during the sheet unit test. For that, the data distributor 250 receives a bias voltage, which enables the transistors (see FIG. 6) included in the data distributor 250 to be off from the seventeenth wire 287 included in the second wire group 280 during the sheet unit test. Here, the data driver 240 and the data distributor 250 are formed on or near the lower side of the display region 230.

The test section 260 receives the red, green, and blue test signals and the test control signal from the thirteenth to sixteenth wires 283 to 286, which are included in the second wire group 280. The test section 260 supplies the red, green, and blue signals to the red, green, and blue sub-pixels of the display region 230 in correspondence to the test control signal supplied during the sheet unit test. Here, the test signals include at least one of signals for determining whether the organic light emitting display device 210 is inferior and are a flickering test signal, an aging test signal or a leakage current test signal, for example. The test section 260 is formed on or near the upper side of the display region 230 so as to be opposite the side on which the data driver 240 and the data distributor 250 are formed.

As mentioned above, a predetermined test is performed in the organic light emitting display device 210 coupled to the first wire group 270 and the second wire group 280 by supplying voltage from the voltage sources and the signals to the first wire group 270 and the second wire group 280 during the sheet unit test. Then, since the test signals supplied to the thirteenth to fifteenth wires 283 to 285 of the second wire group 280 passes through the test section 260 to be supplied to the display region 230, the test signals may not pass through the data distributor 250 when the test can be performed.

Figure 4:
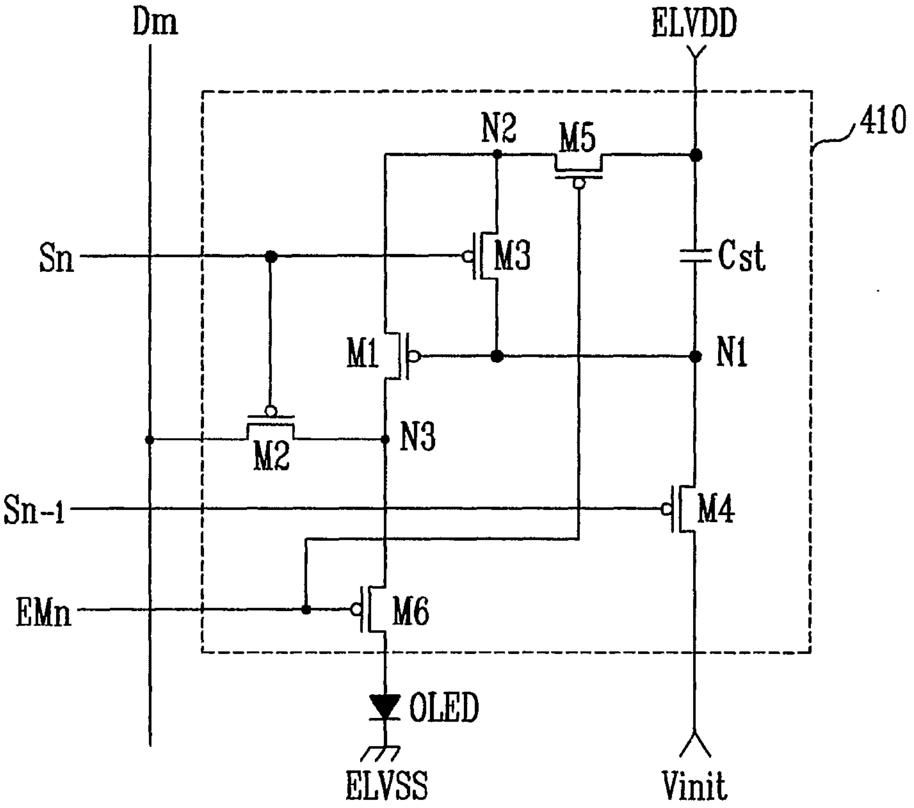
FIG. 4 is a circuit diagram of an embodiment of a sub-pixel of one pixel included in the display region of the organic light emitting display device shown in FIG. 3.

FIG. 4 is a circuit diagram of an embodiment of a sub-pixel included in one of the pixels of a display region of the organic light emitting display device shown in FIG. 3. The circuit diagram of FIG. 4 may also be said to represent a pixel. The circuit diagram of FIG. 4 can represent any one of the red, green, and blue sub-pixels. In one embodiment, there are not significant differences between the red, green, and blue sub-pixels except the color of the OLED used.

Referring to FIG. 4, the sub-pixel includes an organic light emitting diode (OLED), and a pixel circuit 410 coupled to an n-th scan line Sn, an n-th light emitting control line EMn, an m-th data line Dm, a first voltage source ELVDD, an initializing voltage source Vinit, and the OLED, so that the OLED emits light. Depending on whether the sub-pixel is a red, green or blue sub-pixel, the OLED emits red, green or blue light.

The anode electrode of the OLED is coupled to the pixel circuit 410, and the cathode electrode thereof is coupled to the second voltage source ELVSS.

The pixel circuit 410 includes first to sixth transistors M1 to M6 and a storage capacitor Cst. In FIG. 4, although the first to sixth transistors M1 to M6 are shown as P-type transistors, the present invention is not limited thereto.

A first electrode of the first transistor M1 is coupled to a second node N2, and a second electrode thereof is coupled to a third node N3. Further, a gate node of the first transistor M1 is coupled to a first node N1. The first transistor M1 supplies a current corresponding to a voltage stored in the storage capacitor Cst to the third node N3.

A first electrode of the second transistor M2 is coupled to an m-th data line Dm, and a second electrode thereof is coupled to the third node N3. Further, a gate electrode of the second transistor M2 is coupled to a n-th scan line Sn. The second transistor M2 is turned on when the scan signal is supplied to the n-th scan line Sn and supplies a data signal supplied to the m-th data line Dm to the third node N3.

A first electrode of the third transistor M3 is coupled to the second node N2, and a second electrode thereof is coupled to the first node N1. Further, a gate electrode of the third transistor M3 is coupled to the n-th scan line Sn. The third transistor M3 is turned on when the scan signal is supplied to the n-th scan line Sn and the first transistor M1 is coupled to the third transistor M3 in diode type.

A first electrode of the fourth transistor M4 is coupled to the initializing voltage source Vinit, and a second electrode thereof is coupled to the first node N1. A gate electrode of the fourth transistor M4 is coupled to an n-1-th scan line Sn-1. The fourth transistor M4 is turned on when a scan signal is supplied to the n-1-th scan line Sn-1, and initializes the storage capacitor Cst and the gate terminal of the first transistor M1. For that, the voltage value of the initializing voltage source Vinit is set so as to be lower than the voltage value of the data signal.

A first electrode of the fifth transistor M5 is coupled to the first voltage source ELVDD, and a second electrode thereof is coupled to the second node N2. Further, a gate electrode of the fifth transistor M5 is coupled to an n-th light emitting control line EMn. The fifth transistor M5 is turned on when the light emitting control signal is not supplied to the n-th light emitting control line EMn, and transfers the voltage of the first voltage source ELVDD to the second node N2.

A first electrode of the sixth transistor M6 is coupled to the third node N3, and a second electrode thereof is coupled to the anode electrode of the OLED. Further, a gate electrode of the sixth transistor M6 is coupled to the n-th light emitting control line EMn. The sixth transistor M6 is turned on when the light emitting control signal is not supplied to the n-th light emitting control line EMn, and electrically connects the third node N3 to the OLED.

One terminal of the storage capacitor Cst is coupled to the first voltage source ELVDD and the first electrode of the fifth transistor M5, and the other terminal thereof is coupled to the first node N1. The storage capacitor Cst charges a voltage corresponding to a data signal and a threshold voltage Vth of the first transistor M1 when the scan signal is supplied to the n-th scan line Sn, and maintains the charged voltage for one frame.

Figure 5:
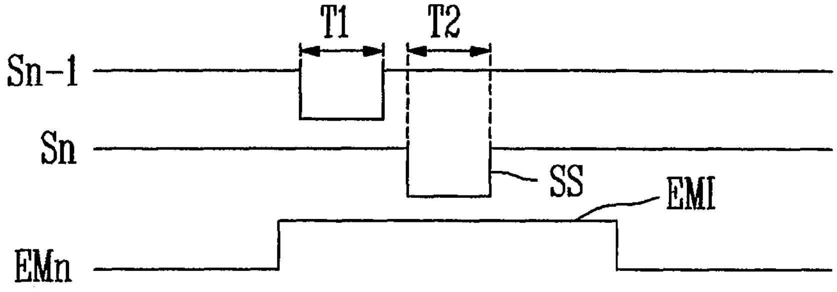
FIG. 5 is a diagram showing a waveform of a control signal for controlling the circuit shown in FIG. 4.

FIG. 5 is a diagram showing a waveform of a control signal for controlling the circuit shown in FIG. 4. The operation of the sub-pixel or pixel shown in FIG. 4 will be described in detail in connection with FIGS. 4 and 5.

Referring to FIG. 5, a scan signal SS is supplied to the n-1-th scan line Sn-1 for a time period of T1, and a light emitting control signal EM1 is supplied to the n-th light emitting control line EMn. If a light emitting control signal EMI is supplied to the n-th light emitting control line EMn, the fifth and sixth transistors M5 and M6 are turned off. Further, the scan signal SS is supplied to the n-1 scan line Sn-1, the fourth transistor M4 is turned on. If the fourth transistor M4 is turned on, the storage capacitor Cst and the gate terminal of the first transistor M1 are coupled to the initializing voltage source Vinit. If the storage capacitor Cst and the gate terminal of the first transistor M1 are coupled to the initializing voltage source Vinit, the initializing voltage source Vinit is supplied to the storage capacitor Cst and the gate terminal of the first transistor M1 for initialization.

Thereafter, a scan signal SS is supplied to the n-th scan line Sn for a time period of T2. If the scan signal SS is supplied to the n-th scan line Sn, the second and third transistors M2 and M3 are turned on. If the third transistor M3 is turned on, the first transistor M1 is coupled in diode type. Further, the second transistor M2 is turned on, the data signal supplied to the m-th data line Dm is transferred to the third node N3. Then, since the gate terminal of the first transistor M1 is initialized to a voltage value lower than the data signal by the initializing voltage source Vinit, the voltage supplied to the third node N3 passes through the first and third transistors M1 and M3 and is supplied to the first node N1. Then, the threshold voltage Vth of the first transistor M1 and the voltage corresponding to the data signal are stored in the storage capacitor Cst.

Thereafter, if the light emitting control signal EMI is not supplied to the n-th light emitting control line EMn, the fifth and sixth transistors M5 and M6 are turned on. If the fifth and sixth transistors M5 and M6 are turned on, a current corresponding to the data signal flows from the first voltage source ELVDD to the OLED and a light corresponding to the data signal is generated in the OLED.

Figure 6:
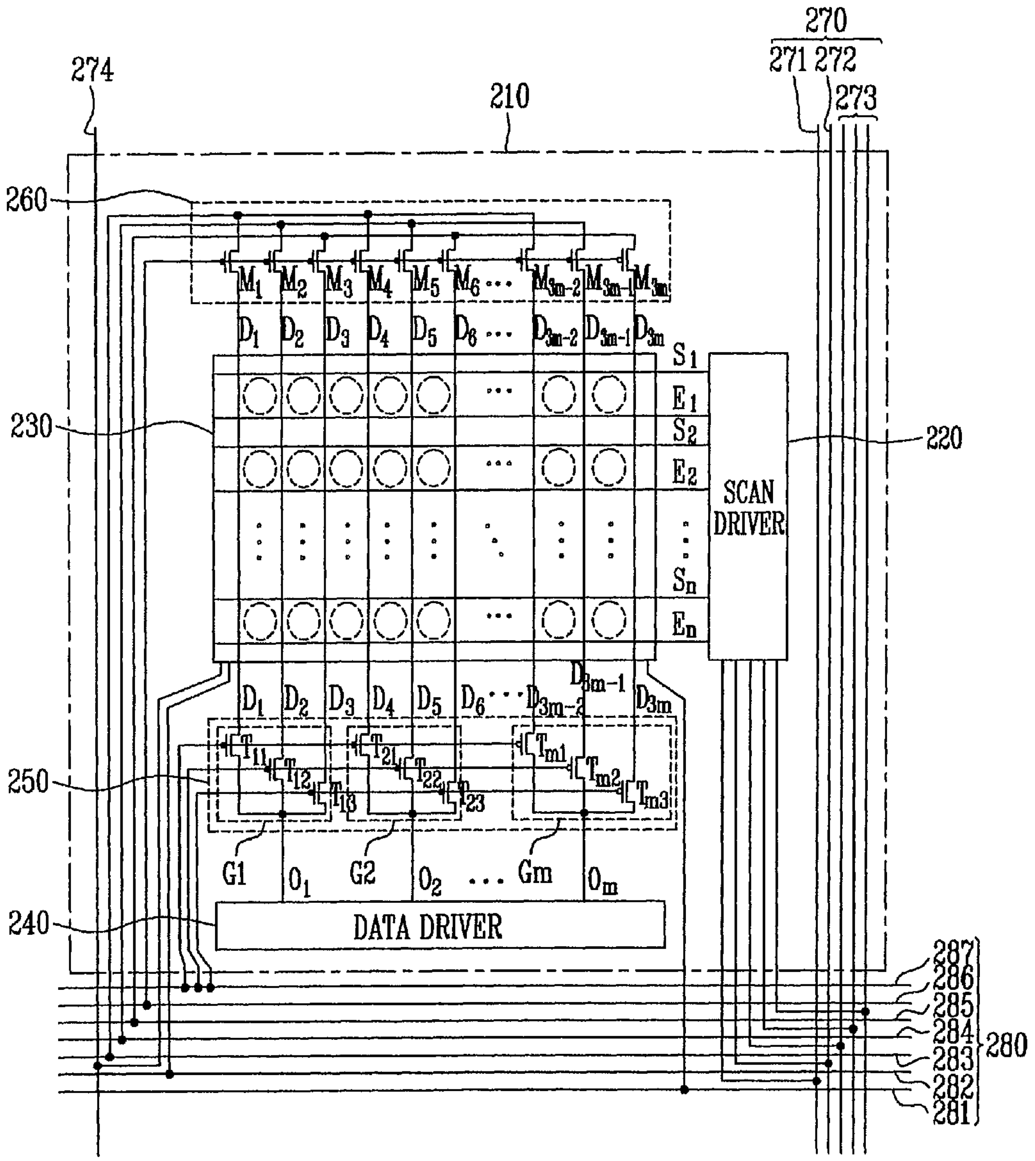
FIG. 6 is a diagram showing an embodiment of a circuit of the data distributor and the test section shown in FIG. 3.

FIG. 6 is a diagram showing an embodiment of a circuit of the data distributor and the test section shown in FIG. 3.

Referring to FIG. 6, in the embodiment shown the data distributor 250 includes a plurality of transistor groups G1 to Gm coupled between the data line D and the output line O of the data driver 240. Each of the transistor groups G1 to Gm includes first transistors T11, T21, . . . , and Tm1 coupled to the data lines D1, D4, . . . , and D3*m*-2 of the red sub-pixel, second transistors T12, T22, . . . , and Tm2 coupled to the data lines D2, D5, . . . , and D3*m*-1 of the green sub-pixel, and third transistors T13, T23, . . . , and Tm3 coupled to the data lines D3, D6, . . . , and D3*m* of the blue sub-pixel. Here, the first transistors T11, T21, . . . , and Tm1 receive externally supplied red clock signals, and the second transistors T12, T22, . . . , and Tm2 receive externally supplied green clock signals, and the third transistors T13, T23, . . . , and Tm3 receive externally supplied blue clock signals. As would be known by those skilled in the art, generally, R, G and B clock signals are generated in an outside oscillatory circuit or a timing controller transmitting the synchronized signal and clock signal from the oscillatory circuit. Hereinafter, the first to third transistors T11 to Tm3 included in the transistor groups G1 to Gm are referred to as distribution transistors.

The distribution transistors T11 to Tm3 supply the data signals supplied from the output lines O1 to Om of the data driver 240 to the data lines D1 to D3*m* corresponding to the red, green, and blue clock signals. In this embodiment, color images are displayed by controlling the red clock signal, the green clock signal, and the blue clock signal. For example, the red clock signal, the green clock signal, and the blue clock signal are supplied at different times to display red, green, and blue images. Further, a white image can be displayed by substantially simultaneously supplying the red clock signal, the green clock signal, and the blue clock signal.

The data distributor 250 is designed such that it is not used during the sheet unit test, and is used when the data signal transferred from the data driver 240 is supplied to the display region 230. The data signal is supplied from a pad section after the organic light emitting display device 210 is scribed from the mother substrate 200. Namely, the data distributor 250 is set so as to be off when the sheet unit test is performed.

If a predetermined test on the organic light emitting display device 210 is to be performed by using the data driver 240 and the data distributor 250, the data driver 240 may receive the test control signal and the test signal. The data driver 240, which has received the test control signal and the test signal, supplies the test signal corresponding to the test control signal to the data distributor 250. The data distributor 250, which has received the test signal, receives the red clock signal, the green clock signal, and the blue clock signal and supplies the test signal to the red, green, and blue sub-pixels in order to perform the test.

As mentioned above, in the case in which a predetermined test is performed by using the data driver 240 and the data distributor 250, the test control signal, the test signal, the red clock signal, the green clock signal, and the blue clock signal, and the like is be supplied from the first wire group 270 and/or the second wire group 280 in order to perform the sheet unit test on the mother substrate 200. Then, a drive problem can be generated due to an RC delay when the signals pass through the first and second wire groups 270 and 280 to be supplied. For example, in the case in which the red clock signal, the green clock signal, and the blue clock signal, which are supplied to the data distributor 250, are delayed and are not supplied at desired times, the time for charging the data voltage in a pixel circuit may not be able to be sufficiently secured and a proper image may not be able to be displayed. Further, it may be difficult to synchronize the control signal, the test signal, the red clock signal, the green clock signal, and the blue clock signal due to the delay.

Therefore, according to one embodiment of the present invention, the data distributor 250 is set so as to be off during the sheet unit test and the test section 260 is separately included, so that the test signal can be directly supplied to the display region 230 through the test section 260 without passing through the data driver 240 and the data distributor 250. For that, the data distributor 250 receives a bias voltage, which enables the distribution transistors T11 to Tm3 included in the data distributor 250 to be turned off from the seventeenth wire 287 included in the second wire group 280, during the sheet unit test. Namely, the gate electrodes of the distribution transistors T11 to Tm3 are coupled to the seventeenth wire 287 to receive the bias voltages from the seventeenth wire 287, during the sheet unit test. The data distribution transistors T11 to Tm3, which have received the bias voltages, remain off. Here, the distribution transistors T11 to Tm3 of the data distributor 250 and the transistors M1 to M3*m* included in the test section 260 are coupled to the opposite end of the data line D. For example, if the distribution transistors T11 to Tm3 of the data distributor 250 are coupled to one end of each of the data lines D, each of the transistors M1 to M3*m* included in the test section 260 is formed so as to be coupled to the other end of the data line D.

On the other hand, the test section 260 includes the plurality of transistors M1 to M3*m* in which the gage electrodes are commonly coupled to the sixteenth wire 286 included in the second wire group 280 for the sheet unit test.

A source electrode of each of the transistors M1 to M3 is coupled to one of the thirteenth to fifteenth wires 283 to 285, and a drain electrode is coupled to one of the data lines D1 to D3*m*. Here, the transistors M1, M4, . . . , and M3*m*-2 coupled to the thirteenth wire 283 are coupled to the data lines D1, D4, . . . , and D3*m*-2 of the red sub-pixel, and the transistors M2, M5, . . . , and M3*m*-1 coupled to the fourteenth wire 284 are coupled to the data lines D2, D5, . . . , and D3*m*-1 of the green sub-pixel, and the transistors M3, M6, . . . , and M3*m* coupled to the fifteenth wire 285 are coupled to the data lines D3, D6, . . . , and D3*m* of the blue sub-pixel. Here, although an embodiment in which each of the transistors M1 to M3*m* is a PMOS is shown, the present invention is not limited thereto.

Hereinafter, the process of performing the test will be described in detail. First, the test control signal is supplied from the sixteenth wire 286 and all of the transistors M1 to M3*m* included in the test section 260 are turned on. Accordingly, the test signals supplied from the thirteenth to fifteenth wires 283 to 285 are supplied to the data lines D1 to D3*m*. Further, voltage from the third voltage source VDD is supplied from the first wire 271 to the scan driver 220, the fourth voltage source VSS from the second wire 272, and the scan control signals from the third wires 273. The scan driver 220, which has received the third voltage source VDD, the fourth voltage source VSS, and the scan control signal, sequentially generates the scan signals and supplies them to the display region 230. Then, the pixels, which have received the scan signal and the test signal, emit lights and display predetermined images to perform the test. Then, the distribution transistors T11 to Tm3 included in the data distributor 250 receives bias voltages from the seventeenth wire 287 and remains turned off. In this way, the test signals supplied to the data lines D1 to D3*m* are not transferred to the data distributor 250.

Here, the red, green, and blue test signals, which pass through the test section 260 and are supplied from the thirteenth to fifteenth wires 283 to 285 to the data lines D1 to D3*m*, can be supplied at different times to display predetermined color images or can be supplied simultaneously. In another embodiment, the test is performed by display the color images in correspondence to the supply times of the red, green, and blue test signals supplied to the thirteenth to fifteenth wires 283 to 285, with the test control signals being supplied to the test section 260 through the sixteenth wire 286.

Then, the test signals can be variously set according to the types of the tests to be performed. For example, in the case in which flickering test signals are applied as test signals, the pixels emit lights in correspondence to the flickering test signals. Here, some of the pixels may not emit lights in a wanted type. In this way, whether the pixels are inferior or not can be determined. Further, the white balances of the pixels can be measured and the proceeding inferiorities can be detected by simultaneously supplying the flickering test signals to the pixels.

On the other hand, aging test signals can be supplied as test signals. The aging test signals are those for supplying high bias voltages or bias currents to the data lines D1 to D3*m*, and are included to detect the proceeding inferiorities of the OLED. Further, whether the OLEDs are normally operated in correspondence to the temperature can be determined by supplying the flickering test signals after the substrate 200 is set to be at a low or high temperature.

Further, leakage current test signals can be supplied as test signals. The leakage current test is performed by measuring the currents flowing to the fourth wire 274 and the eleventh wire 281, with the first voltage source ELVDD and the second voltage source ELVSS being applied to the pixels. Namely, the leakage current can be measured by measuring the currents flowing through the fourth wire 274 and the eleventh wire 281 after the test section 260 is turned off on the whole, with voltages from the first voltage source ELVDD and the second voltage source ELVSS being applied.

The test section 260 is set to maintain an off state if the test is completed. Namely, the test section 260 maintains an off state during a normal drive after each of the organic light emitting display devices 210 is scribed in the mother substrate 200. For that, the control section 260 receives control signals for enabling the test section 260 to be in an off state through the sixteenth wire 286 or the thirteenth to sixteenth wires 283 to 286, after scribed. In other words, the test section 260 maintains an off state after scribed and may exist as only a transistor group.

As mentioned above, since the red, blue, and green signals pass through the test section 260 and then are supplied to the display region 230 during the sheet unit test, with the data distributor 250 maintaining the off state, the drive problem due to an RC delay, which can result during the test using the data distributor 250, can be solved. For example, the problem that the time for charging the data voltage in the pixel circuit cannot be secured can be solved, by supplying the red, blue, and green test signals, with the plurality of transistors M1 to M3*m* included in the sheet unit test being turned on. Further, since the test is performed with the test signals not passing through the data distributor 250, the test control signal, the test signal, the red clock signal, the green clock signal, and the blue clock signal need not be synchronized, thereby removing the difficulty of synchronization.

Figure 7:
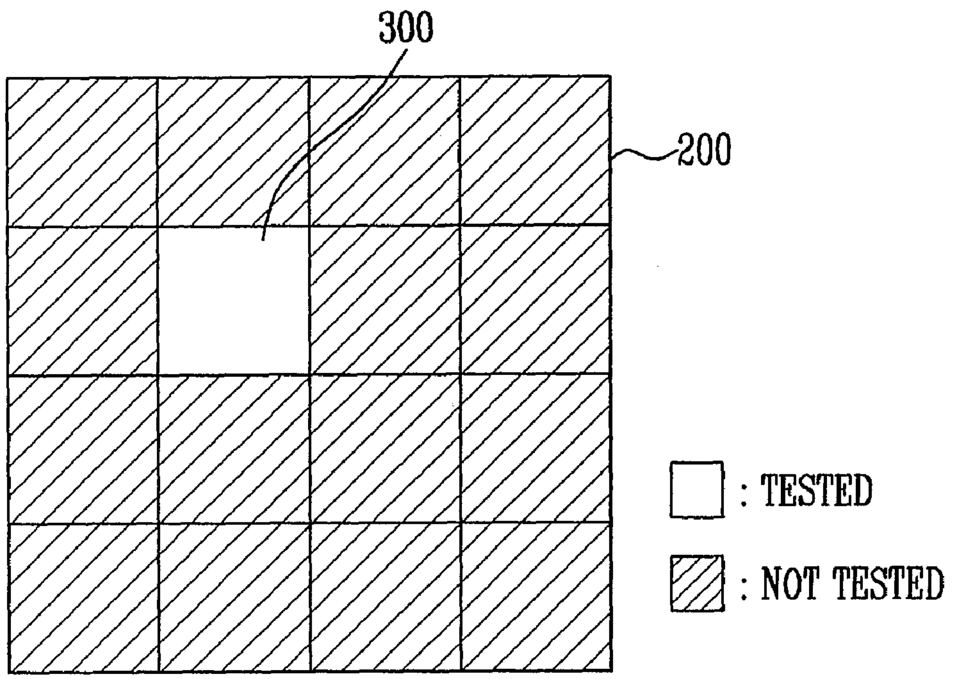
FIG. 7 is a diagram showing an embodiment of a mother substrate, wherein a sheet unit test has been performed on an organic light emitting display device.

FIG. 7 is a diagram showing an embodiment of a mother substrate, wherein a sheet unit test has been performed on an organic light emitting display device.

Referring to FIGS. 3, 6 and 7, the voltage sources and the signals may be supplied only to the first wire group 270 and the second wire group 280 coupled to a predetermined organic light emitting display device 300 formed on the mother substrate 200. The test is performed in the organic light emitting display device 300, and is not performed in the other organic light emitting display devices.

Hereinafter, the test process will be described in detail with reference to FIGS. 3, 6 and 7. First, the test signals and the test control signal are supplied from the thirteenth to sixteenth wires 283 to 286 coupled to the predetermined organic light emitting display device 300. Then, the red, green, and blue test signals are supplied to the data lines D1 to D3*m* in correspondence to the test control signal. Then, the first voltage source ELVDD, the second voltage source ELVSS, and the initializing voltage source Vinit are supplied from the fourth wire 274, the eleventh wire 281, and the twelfth wire 282, and the third voltage source VDD, the fourth voltage source VSS, and the scan control signal are supplied from the first wire 271, the second wire 272, and the third wires 273. Then, a predetermined image is displayed in correspondence to the voltage sources and the signals in the predetermined organic light emitting display device 300 to perform the test. Here, if an aging test signal, a leakage current test signal, and a flickering test signal are supplied as test signals, the aging test, the leakage current test, and the flickering test can be sequentially performed in the predetermined organic light emitting display device 300. In addition, various tests for the selected organic light emitting display device 300 can be performed and the order of the tests can be changed.

Further, according to the present invention, since the voltage sources and the signals are supplied to the first and second wire groups 270 and 280 coupled to at least two organic light emitting display devices among the organic light emitting display devices formed on the mother substrate 200, tests for the at least two organic light emitting display devices can be performed simultaneously. Here, the tests can be sequentially performed by sequentially supplying the aging test signal, the leakage current test signal, and the flickering test signal to the at least two organic light emitting display devices for which the tests are performed. Further, the flickering test, the leakage current test, and the aging test can be simultaneously performed, by simultaneously supplying different signals to the at least two organic light emitting display devices. Further, if the tests for the selected organic light emitting display devices are completed, the tests may be performed after moving by one row or by one column. The tests are continued until the tests for all the organic light emitting display devices 300 formed on the mother substrate 200 are completed.

As mentioned above, according to the organic light emitting display device and the mother substrate for performing the sheet unit test and the testing method, the sheet unit test can be performed, with the plurality of organic light emitting display devices formed on the mother substrate not being scribed, by using the first and second wire groups. Therefore, the efficiency of the test may also increase.

Further, since the test signals do not pass through the data distributor to be supplied to the display region through the test section, the drive problem due to the RC delay may be solved. Namely, since the red, green, and blue test signals are supplied, with the plurality of transistors included in the test section during the sheet unit test being turned on, the problem that the time for charging the data voltage in the pixel circuit can not be secured can be solved. Further, since the test is performed with the test signals not passing through the data distributor, the test control signal, the test signal, the red clock signal, the green clock signal, and the blue clock signal need not be synchronized, thereby potentially removing the difficulty of synchronization.

Although a few embodiments of the present invention have been shown and described, it would be appreciated by those skilled in the art that changes might be made in the embodiments without departing from the principles and spirit of the invention.

What is claimed is:

1. An organic light emitting display device comprising:

a substrate scribed from a mother substrate, the substrate comprising:

a display region including a plurality of pixels coupled to scan lines and data lines;

a scan driver for supplying scan signals to the scan lines;

a data distributor for distributing data driving signals to the data lines as data signals, the data distributor comprising a first transistor group including a plurality of first transistors each of which is coupled to a different one of the data lines, and a second transistor group including a plurality of second transistors each of which is coupled to a different one of the data lines;

a first wire group comprising a plurality of wires extending to a first edge of the substrate; and a second wire group comprising a plurality of wires extending to a second edge of the substrate, the second edge being opposite to the first edge; and a data driver for supplying the data driving signals to the data distributor through output lines, each of the plurality of first transistors being coupled to a same one of the output lines, each of the plurality of second transistors being coupled to a different one of the output lines, wherein one of the wires included in the first wire group or one of the wires included in the second wire group is coupled to gate electrodes of at least two of the second transistors included in the second transistor group, and configured to supply a control signal from the first edge of the substrate to the gate electrodes of the at least two of the second transistors during a test of the substrate before being scribed from the mother substrate, and wherein each of the output lines is for supplying a corresponding one of the data driving signals to be distributed to corresponding ones of the data lines.

2. The organic light emitting display device according to claim 1, wherein the second transistors included in the second transistor group are configured to maintain off states responsive to the control signal supplied to the one of the wires included in the first wire group, or to the one of the wires included in the second wire group.

3. The organic light emitting display device according to claim 1, wherein the data distributor is formed on a first side of the display region and a test section is formed on a second side of the display region, wherein the first side is opposite the second side.

4. A mother substrate comprising:

a plurality of organic light emitting display devices, each of which is configured to be separated from the mother substrate as a unit and to function as an organic light emitting display device comprising a plurality of pixels, at least one of the organic light emitting display devices comprising a substrate configured to be scribed from the mother substrate, the substrate comprising:

a data distributor coupled to data lines; and a test section comprising transistors with corresponding gate electrodes, each of the transistors coupled to one of the data lines, wherein the transistors are configured to substantially simultaneously turn on by a test control signal applied to the gate electrodes and supplied from a wire of a first wire group or a second wire group, the wire extending from an edge of the substrate to the gate electrodes, wherein the first wire group comprises a first plurality of wires, each of the first plurality of wires being coupled to each display device of a first group of the organic light emitting display devices that are arranged substantially in a first direction, and wherein the second wire group comprises a second plurality of wires, each of the second plurality of wires being coupled to each display device of a second group of the organic light emitting display devices that are arranged substantially in a second direction that crosses the first direction.

5. The mother substrate according to claim 4, wherein source electrodes coupled to the transistors included in the test section are coupled to at least one wire of the wires included in the first wire group or the second wire group, and configured to supply test signals to the data lines when the transistors are turned on.

6. The mother substrate according to claim 5, wherein the transistors of the test section comprise first transistors coupled to data lines of red sub-pixels, second transistors coupled to data lines of green sub-pixels, and third transistors coupled to data lines of blue sub-pixels.

7. The mother substrate according to claim 6, wherein the first transistors are configured to receive a red test signal from a first predetermined wire of the wires included in the first wire group or the second wire group, the second transistors are configured to receive a green test signal from a second predetermined wire of the wires included in the first wire group or the second wire group, and the third transistors are configured to receive a blue test signal from a third predetermined wire of the wires included in the first wire group or the second wire group.

8. The mother substrate according to claim 5, wherein one of the test signals is one for performing at least one of a flickering test, a leakage current test, or an aging test.

9. The mother substrate according to claim 4, wherein the data distributor is coupled to a first end of the data lines and the test section is coupled to a second end of the data lines.

10. The mother substrate according to claim 4, wherein the data distributor is configured to receive a bias voltage from a wire of the wires included in the first wire group or the second wire group, wherein the bias voltage enables the data distributor to maintain an off state.

11. The mother substrate according to claim 4, wherein each of the organic light emitting display devices includes a scan driver for supplying scan signals to scan lines; and a display region including the plurality of pixels coupled to the scan lines and the data lines.

12. The mother substrate according to claim 11, wherein the scan driver and the display region are configured to receive voltage from a voltage source and a signal from at least one wire of the wires included in the first wire group or the second wire group.

13. The mother substrate according to claim 4, wherein each of the organic light emitting display devices includes a data driver coupled to the data distributor and is configured to supply data signals to output lines.

14. The mother substrate according to claim 4, wherein a plurality of electric contact points between the first wire group and the second wire group and a plurality of elements formed in the organic light emitting display devices are located outside of a scribing line of the at least one of the organic light emitting display devices.

15. A testing method of an organic light emitting display device for testing one of a plurality of organic light emitting display devices on a mother substrate, each of the plurality of organic light emitting display devices configured to be separated from the mother substrate as a unit and to function as an organic light emitting display device comprising a plurality of pixels, the testing method comprising:

supplying scan driver signals to a scan driver in the one of the plurality of organic light emitting display devices through a first wire group comprising a first plurality of wires, each of the first plurality of wires being coupled to each display device of a first display device group comprising at least two of the plurality of organic light emitting display devices that are arranged substantially in a first direction;

supplying scan signals to scan lines formed in the one of the plurality of organic light emitting display devices while the plurality of organic light emitting display devices are on the mother substrate;

supplying data driving signals to data lines and transistors coupled to the data lines in the one of the plurality of organic light emitting display devices through a second wire group comprising a second plurality of wires, each of the second plurality of wires being coupled to each display device of a second display device group comprising at least two of the plurality of organic light emitting display devices that are arranged substantially in a second direction that crosses the first direction;

substantially simultaneously turning on the transistors coupled to the data lines formed in the one of the plurality of organic light emitting display devices; and transmitting test signals through the transistors, thereby supplying the test signals to the data lines after the transistors are turned on, thereby testing corresponding ones of the plurality of pixels.

16. The testing method according to claim 15, wherein the substantially simultaneously turning on the transistors occurs concurrently with turning off distribution transistors formed in the one of the plurality of organic light emitting display devices and included in a data distributor.

17. The testing method according to claim 15, wherein the test signals include at least one of a red test signal, a green test signal or a blue test signal.

18. The testing method according to claim 15, wherein the test signals perform at least one of a flickering test, an aging test or a leakage current test.

19. A testing method of an organic light emitting display device for sheet unit testing at least one of a plurality of organic light emitting display devices on a mother substrate arranged in a matrix format, each of the plurality of organic light emitting display devices located at an intersection of a particular row and a particular column of the matrix, and configured to be separated from the mother substrate as a unit and to function as an organic light emitting display device comprising a substrate comprising a display region comprising a plurality of pixels coupled to data lines, the method comprising:

selecting a particular organic light emitting display device from among the organic light emitting display devices by supplying first signals to each of the organic light emitting display devices in the particular column and second signals to each of the organic light emitting display devices in the particular row;

supplying a test signal to corresponding ones of the plurality of pixels of the display region of the particular organic light emitting display device while the plurality of organic light emitting display devices are on the mother substrate;

supplying a scan signal to the display region; and providing a bias voltage from an edge of the substrate to a gate electrode of a transistor of a data distributor for distributing data driving signals to the data lines as data signals, the bias voltage being adapted to turn off the data distributor when the test signal is supplied.

20. The testing method of claim 19, wherein the test signal is one of red, blue or green test signals.

* * * * *